United States Patent [19]
Hesterman

[11] 3,976,938
[45] Aug. 24, 1976

[54] SUPERCONDUCTING MAGNETIC SENSOR WITH IMPROVED BALANCING SYSTEM

[75] Inventor: Victor W. Hesterman, Palo Alto, Calif.

[73] Assignee: Superconducting Technology, Inc., Mountain View, Calif.

[22] Filed: Dec. 9, 1974

[21] Appl. No.: 530,625

[52] U.S. Cl. ............................ 324/43 R; 323/44 F
[51] Int. Cl.² ....................................... G01R 33/02
[58] Field of Search .............. 324/43 R, 43 G, 47, 324/.5 H; 323/44 F

[56] References Cited
OTHER PUBLICATIONS

Zimmerman et al. Ultrasensitive Superconducting Magnetic Gradiometer NBS Report; Mar. 31, 1972; pp 1–15.

Clarke; L. F. Applications of Superconducting Quantum Inter Devices; Proc IEEE; Jan. 1973; vol. 61, No. 1, p. 8–19.

*Primary Examiner*—Robert J. Corcoran
*Attorney, Agent, or Firm*—Townsend and Townsend

[57] ABSTRACT

A superconducting magnetic sensor having a sensing coil is provided with one or more superconducting discs for adjusting the effective area of the coil. The effective area of the coil is adjusted by varying the position of the superconducting disc relative to the associated coil. In a superconducting gradiometer having a pair of sensing coils coupled in series opposition, three superconducting discs are arranged to provide effective area adjustment along three mutually orthogonal axes. Coarse and fine adjustment are optionally provided by employing two sets of superconducting discs, one set fixed, the other adjustable.

19 Claims, 10 Drawing Figures

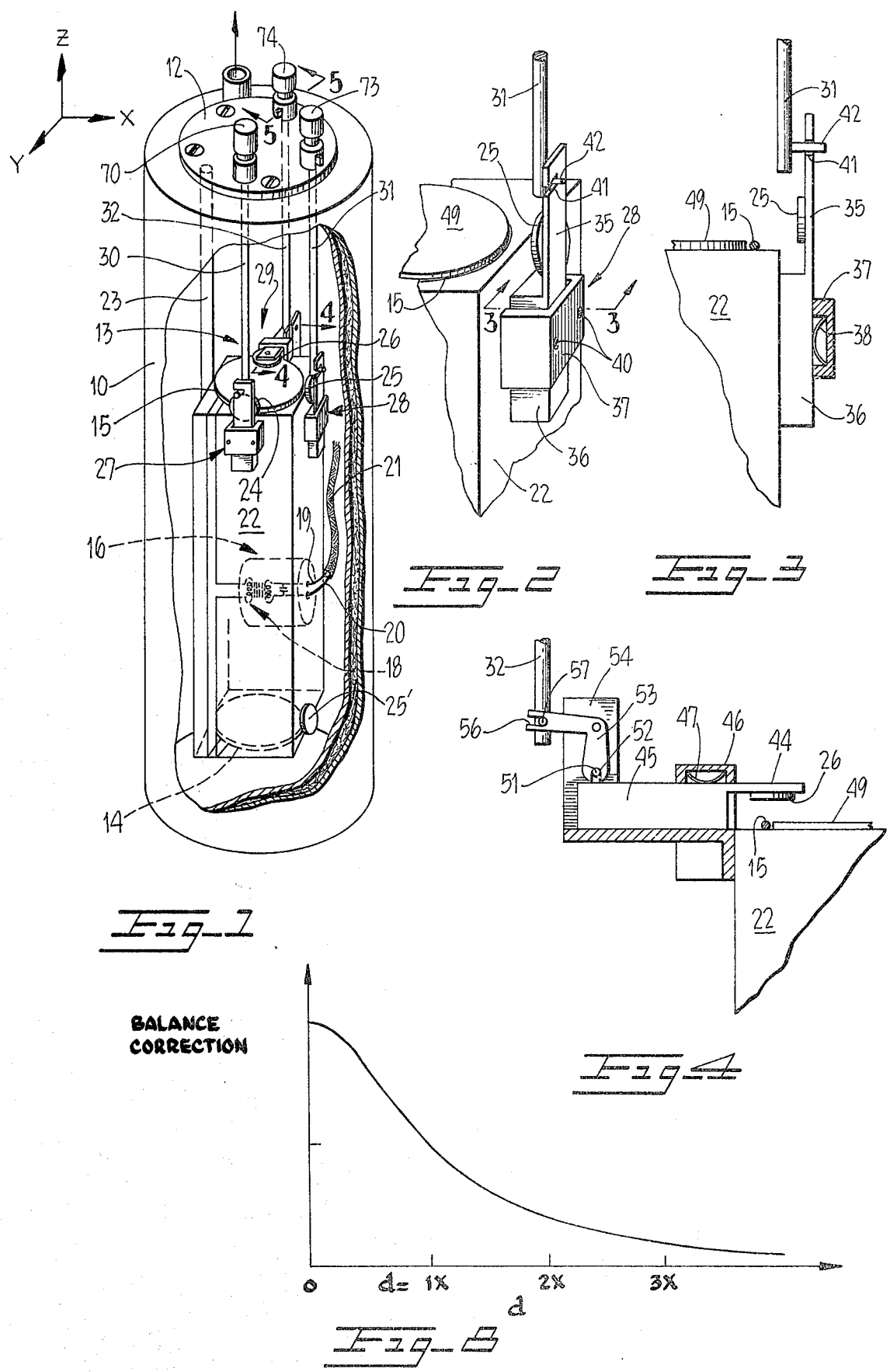

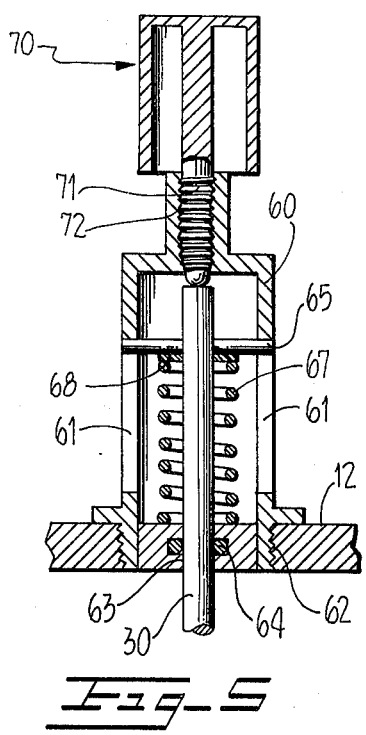
Fig_5
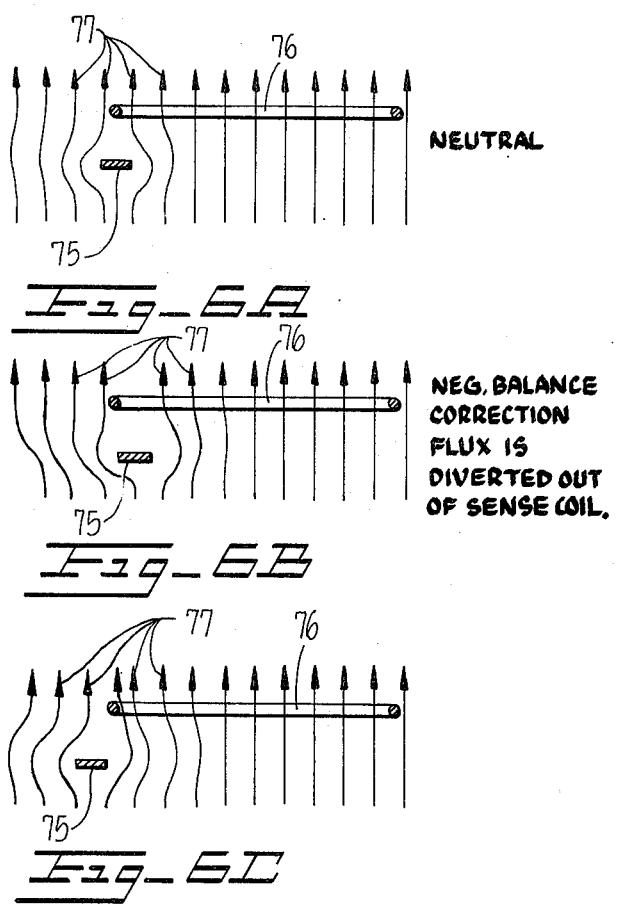
Fig_6A NEUTRAL
Fig_6B NEG. BALANCE CORRECTION FLUX IS DIVERTED OUT OF SENSE COIL.
Fig_6C
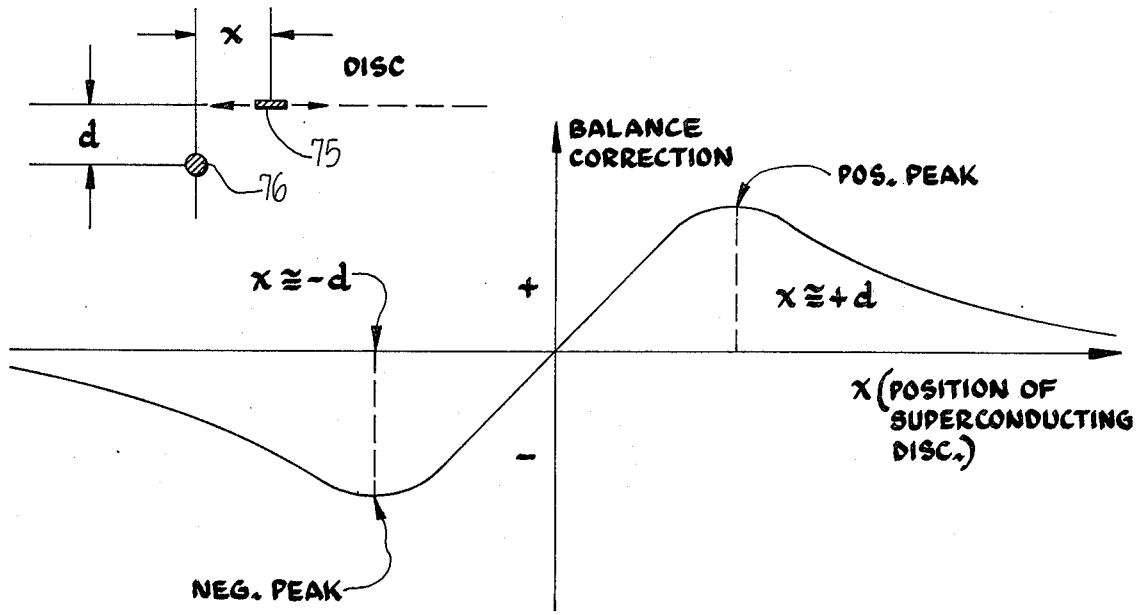
Fig_7

SUPERCONDUCTING MAGNETIC SENSOR WITH IMPROVED BALANCING SYSTEM

BACKGROUND OF THE INVENTION

This invention relates to magnetic sensing devices for measuring the relative strength of a magnetic field or magnetic field gradient. More particularly, this invention relates to magnetic sensing devices in which the active elements are fabricated from superconducting materials and maintained at superconducting temperatures during use.

Superconducting magnetic sensing devices are known in which one or more sensing coils are employed to measure the relative strength of a magnetic field or a field gradient. In typical devices of this type, the sensing coils are fabricated from a superconducting material and are maintained during use at an extremely low temperature at which the material is rendered superconductive.

In order to produce reliable results with such devices, it has been found necessary to provide means for initially adjusting or balancing the effective areas of the sensing coils. In one such arrangement, each sensing coil is balanced by connecting in series with the coil an auxiliary trim coil oriented at an angle to the plane of the sensing coil. By adjusting the area enclosed by the trim coil and the angle of the trim coil relative to the plane of the sensing coil, the desired initial balance condition is attained. However, in order to balance the device, the sensing and trim coils must first be removed from the superconducting environment, after which the trim coils may be adjusted to an empirical area and angular orientation, and the newly-configured coils are then reinstalled in the superconducting environment and a new reading is obtained to determine whether the desired balance condition has been attained. In actual practice, several such empirical attempts must bee made before the device is balanced, which is time consuming, relatively imprecise and thus undesirable.

In another known balancing scheme reported in the National Bureau of Standards Report No. 10,736 dated Mar. 31, 1972 entitled "Ultrasensitive Superconducting Magnetic Gradiometer", a plurality of superconducting vanes are movably arranged in the vicinity of the sensing coils in such a manner that the degree of ambient magnetic field coupling to one relative to the other is altered by shifting the position of the individual vanes. In this arrangement, transverse trimming is provided by vanes disposed about the periphery of the sensing coils while axial trimming is provided by shifting the axial position of a superconductive obstacle disposed intermediate and on the axis of a pair of sensing coils. This arrangement has been found to suffer from two disadvantages: viz., the adjustment afforded is highly non-linear; and an objectionable amount of mutual interaction exists between the various vane adjustments.

In still another arrangement, the inaccuracy and inconvenience in adjustment of the auxiliary trim coil type of balance adjustment mechanism note supra is reduced by having three trim coils, one for each orthogonal coordinate, and surrounding each trim coil with a movably positioned superconducting shield. By individually varying the position of each of the shields, the coupling of the ambient magnetic field to the associated trim coil is altered so that the sensing coils associated to the trim coils can be balanced. This arrangement suffers from the disadvantage that the trim coils must be carefully wound to precise specifications, which increases the overall cost of the device. Further, such coils have been found to be readily susceptible to damage during handling. In addition, the overall sensitivity of the sensing device is diminished by the introduction of the trim coils, and the trim coils further introduce problems of drift and noise.

SUMMARY OF THE INVENTION

The invention comprises a superconducting magnetic sensing device which is inexpensive to manufacture, rugged in construction and easily adjustable to a balanced condition over a relatively wide substantially linear range. In the preferred embodiment, a sensing coil mounted in a superconducting environment is provided with a plurality of superconducting discs translatably mounted for individual movement along orthogonal axes. Adjustment of each individual disc alters the effective area of the sensing coil in a given direction by varying the amount of magnetic flux entering the coil in a direction normal to the plane of the disc. The discs are mounted for individual adjustment by means exterior to the superconducting environment so that full balance adjustment can be effected while the sensing device is operational. The adjustment afforded by the invention is substantially linear over a relatively wide range in both a positive and negative sense.

In a modification of the invention, two sets of superconducting discs are employed to provide both coarse and fine adjustments of the superconducting sensing device. Coarse adjustment proceeds by varying the position of a first set of discs relative to the sensing coil while the device is in an operative state to obtain an approximate balance condition. The device is then warmed to room temperature and the first set of discs or an equivalent set is secured to the sensing coil at equivalent positions to those previously attained. A second set of smaller discs is then installed in the adjustment mechanism, the sensing device is cooled to the operating temperature, and the smaller discs are manually adjusted to the desired balance condition.

For a fuller understanding of the nature and advantages of the invention, reference should be had to the ensuing detailed description taken in conjunction with the accompanying drawings.

BRIEF DESCRIPTION OF THE DRAWINGS

FIG. 1 is a perspective view partially in section of a preferred embodiment of the invention;

FIG. 2 is an enlarged partial perspective view of the disc adjustment mechanism.

FIG. 3 is a sectional view taken along line 3—3 of FIG. 2;

FIG. 4 is an enlarged sectional view taken along line 4—4 of FIG. 1;

FIG. 5 is an enlarged partial sectional view taken along lines 5—5 of FIG. 1;

FIGS. 6a–c are schematic diagrams illustrating the principle of the invention;

FIG. 7 is a plot of correction factor vs. disc position afforded by the invention; and FIG. 8 is a plot of correction factor vs. $d$ for an embodiment of the invention.

DESCRIPTION OF THE PREFERRED EMBODIMENTS

Turning now to the drawings, FIG. 1 illustrates a preferred embodiment of the invention configured as a magnetic gradiometer. As shown in FIG. 1, a Dewar 10 comprising a main body portion 11 and a cover member 12 houses a magnetic gradiometer generally designated by reference numeral 13. Dewar 10 is preferably of a conventional double-walled construction having superinsulative material, such as alternate layers of glass fibre and aluminized Mylar, in the evacuated void between the walls. Gradiometer 13 includes a pair of coaxial, vertically spaced sensing coils 14, 15 coupled in opposing series configuration and electrically terminating in a magnetic flux sensor 16. A change in the ambient magnetic field gradient will cause a differential flux change $\phi_1 - \phi_2$ in the respective sense coils 14, 15. This induces a current in the sense coil circuit which in turn produces a field on the sensor 16 via a field coil, 18. Flux sensor 16 may comprise any one of the number of conventional circuits for generating an electrical output signal representative of the field produced by the current in the field coil such as a weak link Josephson effect sensor, i.e. a SQUID (Superconducting Quantum Interference Device), or a non-superconductive magnetic flux sensor. The SQUID can make use of one or more superconducting point contact, Dayem bridges or Notarys bridges. Details and operations of such flux sensors are well known to those skilled in the art. The electrical output terminals 19, 20 of flux sensor 16 are adapted to be coupled via a coaxial cable 21 to conventional measuring circuitry such as a Model A 301 r.f. amplifier and a Model A 201 Analog Plug-in, the latter comprising a device including a phase shift detector, a local oscillator, a band pass switch and servo feedback circuit and a digital volt meter, both devices being available from Superconducting Technology, Inc. of Mountain View, Ca. Gradiometer 13 is supported on a block 22 fabricated from a suitable non-magnetic material, e.g. quartz, ceramic, or the like. Block 22 is detachably secured to cover member 12 of the Dewar 10 by means of a plurality of support posts 23.

Translatably mounted adjacent sensing coil 15 are a trio of superconducting balance adjustment discs 24—26. Discs 24 and 25 are carried by a pair of adjustment mechanisms 27, 28 described below and are arranged for translational movement along the z - axis in response to the movement of a pair of rods 30, 31. Disc 24 is oriented in the $x-z$ plane, while disc 25 is oriented in the y-z plane. Disc 26 is carried by an adjustment mechanism 29 and arranged for translational movement in the $x-y$ plane in response to the movement of a rod 32.

FIGS. 2 and 3 illustrate translational adjustment mechanism 28 employed for disc 25. As shown in these FIGS., disc 25 is secured to a relieved surface of an elongate slider member 35 having an thickened body portion 36 received in a U shaped recess provided in a guide member 37. Guide member 37 is provided with a spring member 38 received in an inner recess 39, spring member 38 providing a frictional force bearing against the outer surface of slider 35 to maintain slider member 35 in a fixed vertical position. Guide member 37 is secured to block 22 in any suitable fashion, e.g. by means of capscrews 40, or epoxy.

The upper end of slider member 35 is provided with a transverse notch 41 for receiving a pin 42 extending in a general transverse direction from the bottom end of rod 31. In operation, as rod 31 is translated in the general vertical direction slider member 35 follows the motion of pin 42 so that disc 25 is translated along the z axis and maintained in the $y-z$ plane.

FIG. 4 illustrates the translational adjustment mechanism 29 for disc 26. As shown in this FIG., disc 26 is secured to a recessed underside portion of a slider 44 similar in construction to slider 35. Slider 44 has a thickened body portion 45 received in a U shaped aperture provided in a guide member 46 essentially similar to guide member 37 and having a spring member 47 for frictionally maintaining slider member 44 in a desired position. Slider member 44 is supported on a sense coil form 49 mounted to the top of block 22. The end of slider member 44 remote from disc 26 is provided with an upstanding rigid member 51 received in a notch 52 in the lower end of a crank 53 mounted on a support arm 54, support arm 54 being fixed to block 22. The other arm of crank 53 is provided with a notch 56 for receiving a pin 57 which extends transversely of rod 32. In operation, vertical motion of rod 32 along the z axis is converted by crank 53 into motion of disc 26 along the y axis, with disc 26 being confined to the $x-y$ plane.

FIG. 5 illustrates the manner in which rods 30–32 are mounted in cover 12 for translational motion along the z axis, the arrangement being substantially identical for the three rods. As shown in this FIG., a housing 60 having a hollow interior and a pair of opposing slots 61 formed in the sidewall thereof is threadably engaged in a threaded annular recess 62 in cover 12. The upper end of rod 30 is is slidably received in an aperture 63 provided with an O-ring seal 64. The upper end of rod 30 is provided with a locking pin 65 extending transversely of rod 30 for engagement in slots 61. A conventional biasing spring 67 and washer 68 are arranged substantially concentrically of rod 30 in the hollow interior of member 60 in the region between pin 65 and the upper surface of cover 12. This arrangement provides an upward bias on rod 30. An adjustment member 70 having a threaded central spindle 71 is threadably engaged in a threaded bore 72 in the upper portion of member 60, with the lower end of spindle 71 in contact with the upper end of rod 30. In operation, rotation of member 70 in a first direction advances spindle 71 in bore 72 to thereby drive rod 30 downwardly along the z axis; conversely, rotation of adjustment member 70 in the opposite direction permits bias spring 67 and washer 68 to urge rod 30 in the upward direction along the z axis. Rotation of rod 30 is prevented during adjustment by the engagement between pin 65 and slots 61.

In use, Dewar 10 is filled with liquid helium or an equivalent cryogenic substance in order to provide a low temperature environment in the interior thereof. Magnetic gradiometer 13 is next inserted into Dewar 10 and cover 21 is secured thereto. The device is next placed in a known uniform magnetic field and electrical output terminals 19, 20 are coupled to the measuring circuit. The superconducting gradiometer 13 is then adjusted for a balance condition by manually rotating adjustment members 70, 73 and 74 to translate discs 24–26 along their respective axes of translation while observing the visual indicator of the measuring device.

FIGS. 6a—c illustrate the trimming or balancing effected by shifting the position of a superconducting disc 75 relative to the perimeter of a superconducting sensing coil 76 in the presence of a magnetic field indicated by field lines 77 when elements 75, 76 are placed in an environment in which they are superconductive. Since a superconducting disc 75 is diamagnetic, the magnetic field that is applied after the discs are superconducting fringes around the disc. By translating disc 75 from a neutral position such as illustrated in FIG. 6a to an arbitrary position inwardly of the perimeter of coil 76, field lines which fringe around disc 75 are deflected out of the area circumscribed by coil 76 so that the total field passing through the coil 76 is decreased. Similarly, by moving disc 75 outwardly of the perimeter of sensing coil 76 as depicted in FIG. 6c, the total field passing through the area circumscribed by coil 76 is increased.

FIG. 7 shows a plot of correction factor versus disc position $x$ with constant normal separation distance $d$ between disc 75 and coil 76. As shown in this plot, the correction factor varies from a negative peak at $x=-d$ to a positive peak at $x=+d$. The origin represents the position at which disc 75 is centered over the perimeter of coil 76. It is important to note that both a positive and a negative correction factor is provided by the invention and that the rate of change of correction factor with disc position is substantially linear over a major portion of the curve between the two maxima. Thus, by employing three superconducting slugs adjustable in three orthogonal planes, the magnitude of the magnetic field entering a sensing coil in three orthogonal directions can be adjusted to balance the sensing coils. In the magnetic gradiometer of FIG. 1, for example, the effective area of sensing coil 15 can be adjusted to be substantially identical to the effective area of sensing coil 14 so that a uniform magnetic field change will produce a differential, i.e. gradiometer, reading of zero.

While excellent results have been obtained with circular superconducting trimming discs, the actual geometric shape thereof is not critical and other configurations may be employed, such a elliptical, oval, rectangular or trapezoidal discs having plano-concave, plano-convex, double-concave, double-convex, and concavo-convex cross sections. Best results have been obtained with discs having a thickness substantially less than the remaining dimensions (e.g. length and width, or surface area) so that balance correction is only obtained in a direction perpendicular to the disc. This results from the fact that a thin disc does not appreciably disturb magnetic fields that are parallel to the plane of the disc. Thus movement of a thin disc that is oriented perpendicular to the X-axis will not alter the Y or Z axis balance. The trimming discs may be fabricated from a variety of superconducting materials of either type I or type II. Example of type I superconducting materials are lead, tin, indium and mercury. Some examples of type II superconducting materials are tantalum, vanadium, niobium, and alloys of niobium-tin, niobium-titanium, and niobium-zirconium. For sensing coils having a coil diameter of five centimeters and a wire thickness of 0.012 centimeters, excellent results have been obtained with circular superconducting discs having a diameter of 1 millimeter, a thickness of 0.005 millimeters, and a displacement, distance of 1 millimeter. The actual disc shape, dimensions and materials can either be determined for any given application on an empirical basis, or from the following approximate formula for the correction factor:

$$C = \frac{V \; x}{2\pi N \, A(x^2 + d^2) \; (1-D)}$$

where C is the off balance signal; V is the volume of the trimming disc; $x$ is the displacement of the disc from the neutral positions; N is the number of turns in the sensing coil; $d$ is the displacement of the trimming disc above the coil; D is the demagnetizing factor of the disc, which is a function of shape; and A is the area circumscribed by the coil. It should be noted that the above mathematical expression is approximate only, and provides best results for those applications in which the disc diameter is less than the displacement $d$. For further parametrical considerations, reference may be had to the article entitled "The Demagnetizing Factors for Ellipsoids," Stoner, Philosophical Magazine, Volume 36, page 803 (1945), and the well-known treatise "Ferromagnetism" by Bozorth.

In some applications it is desirable to provide both a coarse and a fine adjustment capability for a magnetic sensing device. In such applications, two sets of superconducting trimming discs are employed, a large or coarse adjustment set and a small or fine adjustment set. Balancing of the magnetic sensor proceeds by installing the larger set of trimming discs on the translatable adjustment mechanisms 27–29 of FIG. 1 and adjusting the relative position of the individual discs to obtain a coarse balance. Thereafter, the sensing device 13 is removed from the superconducting environment, the positions of the larger discs are noted and the larger discs are secured in their equivalent fixed positions relative to the perimeter of lower coil 14. With reference to FIG. 1, a large or coarse adjustment disc 25' is shown secured adjacent coil 14 in such a position. The disc 25' may be secured in any convenient manner, e.g. by a non-magnetic adhesive substance such as epoxy resin or the like. After the coarse trimming discs have been so secured, a set of fine adjustment discs are installed on the sliders and the magnetic sensing device 13 is re-installed in the superconducting environment of the Dewar 10. A fine balance adjustment is now performed by manipulating control rods 30–32 in the manner noted supra.

The equivalent position of a coarse adjustment disc 25' is obtained by noting the position of a disc relative to upper coil 15 and securing the adjustment disc 25' in the inverse position along the same axis adjacent coil 14. For example, if the position of the disc on adjustment mechanism 28 required for balance is above the plane of upper coil 15, the corresponding disc 25' is secured adjacent lower coil 14 a like distance below the plane of coil 14. Similarly, if the position of disc 26 required for balancing is inwardly of the perimeter of upper coil 15, a corresponding disc 26' is secured below lower coil 14 a like distance outwardly from the perimeter of coil 14.

Magnetic sensing devices provided with superconducting adjustment discs in accordance with the invention described above are relatively inexpensive to manufacture and extremely simple to adjust. Since there is no need to alter the physical placement or configuration of the sensing coils, these coils can be initially manufactured to extremely close tolerances so that only slight or fine trimming is required to render the device operable. In addition, since the correction factor is substantially linear and affords both positive and negative correction, highly accurate and stable balancing may be readily achieved with devices employing the invention.

In some applications it has been found acceptable to modify the motion of disc 26 from motion along the Y axis confined in the *xy* plane to motion along the z axis, i.e. in the direction *d* shown in FIG. 7. This may be accomplished by mounting disc 26 to the end of a slider of the type discussed above the reference to adjustment mechanism 28, with the disc 26 arranged in the *x—y* plane and the slider translatable along the Z axis. This has the advantage of eliminating the mechanism shown in FIG. 4 and results in a substantial reduction in manufacturing cost. With such an arrangement, the substantially linear bipolar correction factor profile shown in FIG. 7 is replaced by one which is not bipolar and is non-linear. The correction factor obtainable with this alternate arrangement is shown in FIG. 8 which is a plot of balance correction C versus *d* as obtained from the equation supra. As seen from this plot, this alternate arrangement still provides a relatively wide range of adjustment which has found to be suitable and adequate in many applications.

While the above provides a full and complete disclosure of the preferred embodiments of the invention, various modifications, alternate constructions and equivalents may be employed without departing from the spirit and scope of the invention. For example, other adjustable translational arrangements may be employed for superconducting discs 24–26 if desired. Therefore, the above description and illustrations should not be construed as limiting the scope of the invention, which is defined by the appended claims.

What is claimed is:

1. In a superconducting magnetic sensing device having at least one sensing coil in a superconducting environment for generating a signal representative of a local magnetic field and means for balancing said device to an initial state, the improvement wherein said balancing means comprises at least one superconducting member mounted closely adjacent a peripheral portion of said coil in said environment for trimming the magnetic field sensed by said coil, said superconducting member having a maximum longitudinal dimension substantially less than the diameter of said coil and a maximum thickness dimension substantially less than said maximum longitudinal dimension in order to provide substantial interactions only with that component of said magnetic field extending in a direction normal to said longitudinal dimension and parallel to said thickness dimension, and means for varying the position of said superconducting member relative to said coil, said position being limited to a region in the immediate vicinity of said coil.

2. The combination of claim 1 wherein said balancing means comprises a pair of superconducting members oriented in mutually orthogonal planes and means for independently varying the position of each of said superconducting members relative to said coil.

3. The combination of claim 1 wherein said balancing means comprises three superconducting members oriented in mutually orthogonal planes and means for independently varying the position of each of said superconducting member relative to said coil.

4. The combination of claim 1 wherein said superconducting member is fabricated from the group consisting of type I and type II superconducting materials.

5. A magnetic sensing device for generating signals representative of a local magnetic field, said device comprising:
   a housing for providing a superconducting environment;
   a superconducting sensing coil positioned in said environment;
   at least one superconducting member positioned in said environment closely adjacent a peripheral portion of said coil for trimming the magnetic field adjacent said coil, said superconducting member having a maximum longitudinal dimension substantially less than the diameter of said coil and a maximum thickness dimension substantially less than said maximum longitudinal dimension in order to provide substantial interaction only with that component of said magnetic field extending in a direction normal to said longitudinal dimension and parallel to said thickness dimension, and
   means for varying the position of said superconducting member relative to said coil, said position being limited to a region in the immediate vicinity of said coil.

6. The combination of claim 5 further including a plurality of superconducting members for independently trimming said field along mutually orthogonal axes and wherein said varying means comprises means or independently varying the position of each of said superconducting members relative to said coil.

7. The combination of claim 5 wherein said superconducting member is fabricated from the group consisting of type I and type II superconducting materials.

8. The combination of claim 5 wherein said means for varying the position of said superconducting member includes a slider member translatably arranged in said housing, said superconducting member being secured to said slider member in a position adjacent said coil, means for maintaining said slider member in a fixed attitude relative to said coil, and means for translating said slider member along a predetermined axis.

9. The combination of claim 8 wherein said translating means includes a rod having a first end coupled to said slider member and a second end extending exteriorally of said housing, and means for translating said rod along said axis.

10. The combination of claim 9 further including coupling means for coupling said rod to said slider member, said coupling means including a support member fixed with respect to said coil, and a crank member pivotally mounted on said support member and having a first end coupled to said slider member and a second end coupled to said rod.

11. A method for balancing a magnetic sensing device having at least one sensing coil in a superconducting environment for generating a signal representative of a local magnetic field, said method comprising the steps of:
   a. positioning at least one superconducting member closely adjacent a peripheral portion of said coil in said environment, said superconducting member having a maximum longitudinal dimension substantially less than the diameter of said coil and a maximum thickness dimension substantially less than said maximum longitudinal dimension;

b. trimming substantially only that component of said magnetic field extending in a direction substantially normal to said longitudinal dimension and substantially parallel to said thickness dimension by varying the position of said superconducting member relative to said coil, limiting said position to a region in the immediate vicinity of said peripheral portion of said coil;

c. measuring the variation of signal strength with position of said superconducting member; and d. maintaining said superconducting member in a position at which the magnitude of said signal indicates a balance condition.

12. The method of claim 11 further including the steps of positioning a plurality of said superconducting members each in a different predetermined plane relative to said coil, independently trimming a corresponding plurality of components of said magnetic field, each said component extending in a different direction normal to the plane of an associated one of said superconducting members, by varying the position of each of said superconducting members while limiting the position of each of said plurality of superconducting members to a region in the immediate vicinity of said peripheral portion of said coil and maintaining said superconducting members in those positions at which the magnitude of said signal indicates a balance condition.

13. The method of claim 12 wherein said predetermined planes are mutually orthogonal.

14. A magnetic gradiometer for generating an electrical output signal representative of a change in ambient magnetic field gradient, said gradiometer comprising:

a housing having a bottom, a side wall and a top defining a hollow interior, said housing being fabricated from a material providing a substantially superinsulative environment in said interior;

a mounting block removable received in said interior;

a pair of sensing coils mounted on said block at positions spaced along an axis of said housing and in substantially parallel planes, said coils being connected in series configuration;

a flux sensor coupled to said coils and having an output adapted to be coupled to a measuring circuit;

a translatable member coupled to said mounting block for motion along a predetermined direction;

means carried by said housing for translating said member along said direction; and a superconducting member having a maximum longitudinal dimension substantially less than the diameter of one of said coils and a maximum thickness dimension substantially less than said maximum longitudinal dimension, said superconducting member being mounted on said translatable member closely adjacent a peripheral portion of one of said coils for varying substantially only that component of the magnetic field entering said one of said coils in a direction substantially normal to said longitudinal dimension and substantially parallel to said thickness dimension in response to movement of said translatable member in order to enable balancing of said gradiometer.

15. The combination of claim 14 further including second and third translatable members coupled to said mounting block for motion along second and third predetermined directions, said directions being mutually orthogonal;

second and third means carried by said housing for translating said second and third members along said second and third directions; and second and third superconducting members mounted respectively on said second and third translatable members closely adjacent peripheral portions of said one of said coils for varying substantially only the component of the magnetic field entering said one of said coils in a direction substantially normal to the longitudinal dimension and substantially parallel to the thickness dimension thereof.

16. The combination of claim 15 wherein said superconducting members are fabricated from the group consisting of type I and type II superconducting materials.

17. The combination of claim 14 wherein said translating means includes a rod having a first end coupled to said translatable member and a second end extending exteriorally of said housing, and means for translating said rod along said direction.

18. The combination of claim 17 further including coupling means for coupling said rod to said translatable member, said coupling means including a support member fixed with respect to said one of said coils, and a crank member pivotally mounted on said support member and having a first end coupled to said translatable member and a second end coupled to said rod.

19. The combination of claim 14 wherein said translatable member includes a slider member translatably arranged on said mounting block, said superconducting member being secured to said slider member in a position closely adjacent said one of said coils, and bias means for maintaining said slider member in a fixed attitude relative to said one of said coils, said bias means providing a bias force having a magnitude less than that provided by said translating means.

\* \* \* \* \*